United States Patent [19]

Sumiyoshi

[11] Patent Number: 4,934,307
[45] Date of Patent: Jun. 19, 1990

[54] APPARATUS FOR APPLICATION OF FLUX

[75] Inventor: Ikuo Sumiyoshi, Kashiwa, Japan

[73] Assignee: Shiki Roll Kabushiki Kaisha, Tokyo, Japan

[21] Appl. No.: 293,631

[22] Filed: Jan. 5, 1989

Related U.S. Application Data

[63] Continuation-in-part of Ser. No. 053,081, May 22, 1987, abandoned.

[30] Foreign Application Priority Data

May 22, 1986 [JP] Japan .................................. 61-76292

[51] Int. Cl.⁵ .............................................. B05C 5/02
[52] U.S. Cl. ...................... 118/74; 118/410; 228/37; 228/43
[58] Field of Search ................. 118/72, 73, 74, 410; 228/37, 43

[56] References Cited

U.S. PATENT DOCUMENTS

| | | | |
|---|---|---|---|
| 2,267,877 | 12/1941 | Schell | 118/74 |
| 3,135,630 | 6/1964 | Bielinski et al. | 118/74 |
| 3,218,193 | 11/1965 | Isaacson | 118/74 |
| 3,724,418 | 4/1973 | McLain | 118/74 |
| 4,684,544 | 8/1987 | Arnett | 427/96 |
| 4,796,558 | 1/1989 | Chartrand et al. | 118/74 |

*Primary Examiner*—Jay H. Woo
*Assistant Examiner*—K. P. Nguyen
*Attorney, Agent, or Firm*—Gordon W. Hueschen

[57] ABSTRACT

An apparatus for the application of foam flux in a system for soldering printed boards, including a flux tank, a partition possessing a top portion rising above the fixed level of flux liquid and containing near the bottom portion thereof a perforated portion, serving to divide the interior of the flux tank into an inner tank portion and an outer tank portion, and a plurality of porous tubes disposed inside the inner tank portion having one end thereof communicating with an external compressed air feed mechanism and the other end thereof closed, the improvement wherein the porous tubes are porous ceramic tubes and are each obtained by molding an aggregate of uniform and fine ceramic-forming particles into the shape of a tube with the aid of an organic plasticizer and an inorganic binder and calcining, the porous tubes possessing pore diameters in the range of 10 to 30 microns and a porosity in the range of 35 to 55%.

8 Claims, 4 Drawing Sheets

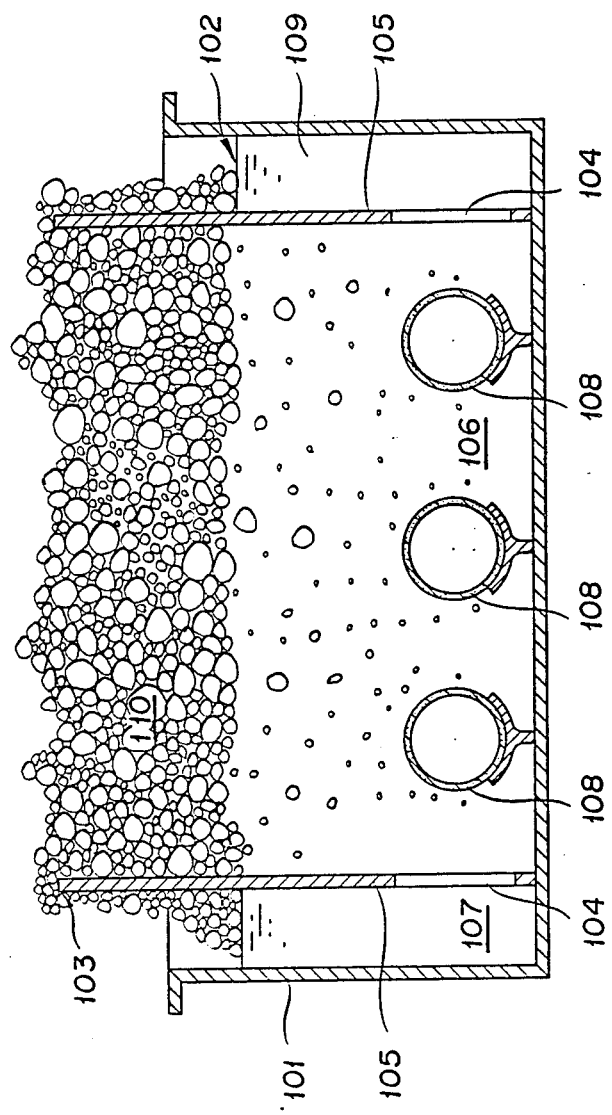

APPARATUS FOR APPLICATION OF FLUX

This is a continuation-in-part of copending application Ser. No. 053,081, filed May 22, 1987, now abandoned.

BACKGROUND OF THE INVENTION

1. Field of the Invention

This invention relates to an apparatus for the application of flux. More particularly, it relates to an apparatus for foam flux application, which enables the application of flux on printed boards to be effected by foaming the flux and bringing the printed boards into contact with the foam flux thereby fracturing the foam flux and allowing the scattered flux to land on and coat the printed boards.

2. Description of the Prior Art

In recent years, the process of soldering the printed boards is tending increasingly toward automation owing to the devotion of industrial efforts to operational rationalization. The automatic soldering of printed boards is generally accomplished by causing printed boards to be set fast at the fixed positions on a conveying means, moving the conveying means carrying the printed boards thereon through the interior of the soldering system, performing on the printed boards in motion the sequential steps of flux application, preheating, soldering, cutting lead terminals of part, and cleaning and optionally the further steps of flux application, preheating, finish soldering, and washing. The printed boards on which the soldering operation has been completed are removed from the conveying means. In the meantime, new printed boards are set fast at the fixed positions on the conveying means.

In the automatic soldering system of the kind described above, the application of flux can be carried out by immersing the printed boards brought in as carried on the conveying means into a flux tank. In accordance with this method, if the printed boards are immersed in the tank as conveyed in the horizontal direction, the flux liquid with which the printed boards come into contact exerts fluid resistance upon the printed boards in motion. If the speed of this conveyance is high, there is the possibility that the various electronic components disposed on the printed boards will be separated from the printed boards by this fluid resistance. The immersion, therefore, must be effected by advancing the printed boards on the conveying means downwardly into the flux tank, necessitating use of a complicate conveying mechanism. Further, because of the interfacial tension to be exerted on the faces of contact, uniform application of flux on all the printed boards is attained only with difficulty. There is another hard problem, i.e. the difficulty to be encountered in keeping the level of the flux liquid constant because the level inevitably falls with the use of the flux liquid.

For the purpose of overcoming the drawbacks suffered as described above by the prior art, apparatuses for foam flux application constructed as disclosed in Japanese Patent Laid-Open SHO No. 60(1985)-121,065, for example, have been developed and found actual utility as means of flux application. One foam flux application apparatus comprises, as illustrated in FIG. 6, a flux tank 101, a partition 105 possessing a top portion 103 rising above the fixed level 102 of flux liquid held inside the flux tank 101, containing near the bottom portion thereof a perforated portion 104, and serving to divide the interior of the flux tank 101 into an inner tank portion 106 and an outer tank portion 107, and one or more porous tubes 108 disposed inside the inner tank portion 106 and adapted to communicate with a compressed air feed mechanism (not shown). When compressed air is fed from the compressed air feed mechanism into the porous tube 108, it is blown out of the numerous pores in the porous tube 108 to foam a flux liquid 109. The foamed flux liquid 109 rises inside the partition 105 and forms a foam layer 110 on the empty space (the inner tank portion 106) enclosed with the partition 105. The foam flux liquid 109 which has overflowed the top of the partition 105 flows down the lateral surface of the partition 105 and falls into the outer side (outer tank portion 107) of the partition 105. In the flux tank 101, the inside and the outside of the partition 105 communicate with each other via the perforation 104. When the supply of flux liquid in the inner tank portion 106 falls short, the flux liquid inside the outer tank portion 107 flows through the perforation 104 into the inner tank portion 106 to replenish. In this apparatus, the application of flux on a printed board is effected by moving the printed board in a horizontal direction while allowing the printed board to come into contact with the upper surface of the foam layer 110 formed as described above thereby fracturing the portion of the foam flux with which the printed board has come into contact and allowing the scattered flux to land on and wet the printed board.

When the application of flux is carried out by the use of the conventional foam flux application apparatus, however, the upper side of the foam flux layer does not form a uniform flat surface because it is undulated or compelled to form depressions shaped like craters locally. Thus, there is the possibility that part of the printed board will escape coming into contact with the upper surface of the foam flux layer. At times, the flux, on being foamed, gives rise to giant bubbles. There is the possibility that when the printed board comes into contact with such a giant bubble and fractures this giant bubble, the fine droplets of flux scattered from the fractured giant bubble will fail to land on part of the printed board. In any event, uniform application of the flux on the printed board has been impeded by these phenomena. In the printed boards of the recent development are included those of the type having chips and other similar parts mounted on the surfaces intended for soldering. When the printed boards of this type are to be soldered, the adverse phenomena are posed as serious problems. Since the application of flux is intended to remove a thin film of copper oxide formed on the surface of copper foil of the printed board thereby ensuring intimate adhesion of solider to the copper foil during the course of soldering operation, the failure to effect uniform application of flux to the printed board results in a defection of the soldering operation and an impairement of the economic value of the product to be obtained at all.

A study continued to determine the cause has led to a conclusion that the defective foaming of flux is mainly ascribable the porous tube to be used in the apparatus. The porous tube used in the conventional foam flux apparatus has been made of biscuit or sintered stainless steel. In the case of a porous tube of biscuit, substantially no control is made of pore distribution or pore diameter distribution during the course of the production of the tube. In the case of a tube of sintered metal, the porosity thereof is low. Since this tube is produced by first making a sintered plate and then molding the sintered plate in the shape of a tube, the pore diameters first fixed in the sintered plate are decreased on the inner side of the tube and increased on the outer side of the tube and part of the pores are closed, making the control of pore distribution and pore diameter distribution difficult. As the result, the porous tube fails to generate uniform fine bubbles of flux and entails the problems mentioned above.

Further the porous tube of biscuit suffers from very weak strength, insufficient durability, and heavy dispersion of quality. In the case of the porous tube of sintered metal, since it is kept immersed in the flux, it has the possibility of being corroded by a chemical reaction when the flux is deteriorated to the extent of generating an acid or an alkali. Further, since it is obtained by rolling a sintered plate in the shape of a tube, it must be disposed so that the welded portion will fall on the underside.

Further, the defective foaming of the flux is also ascribable partly to the fact that the flux converted into a sludge by aging enters the pores in the porous tube and solidifies therein during the stop of the operation of the apparatus to alter the pore diameters.

The present invention, therefore, aims to solve the various problems mentioned above.

An object of this invention is to provide an improved apparatus for the application of flux.

Another object of this invention is to provide for an automatic soldering equipment an apparatus for foam flux application capable of uniformly applying flux on a printed board.

Yet another object of this invention is to provide an apparatus for the application of flux which has little possibility of yielding defective products during the course of soldering of printed boards.

From a different point of view, this invention has a further object of providing for incorporation in a system for soldering printed boards, an apparatus for the application of foam flux which is capable of uniformly and finely foaming a flux thereby forming a foam flux layer possessing a substantially flat and smooth upper surface and allowing the upper surface to contact a printed board being brought in as supported on a conveying device thereby fracturing the foam flux and enabling the scattered droplets of flux from the fractured foam flux to be uniformly applied on the surface of the printed board intended for soldering.

SUMMARY OF THE INVENTION

The objects described above are accomplished by an apparatus for the application of foam flux in a system for soldering printed boards, comprising a flux tank, a partition possessing a top portion rising above the fixed level of flux liquid, containing near the bottom portion thereof a perforated portion, and serving to divide the interior of the flux tank into an inner tank portion and an outer tank portion, and plurality of porous tubes disposed inside said inner tank portion and having one end thereof communicating with an external compressed air feed mechanism and other end thereof closed, which porous tubes are characterized by the fact that they are porous ceramic tubes obtained by extrusion molding an aggregate of uniform and fine ceramic-forming particles having an average particle diameter of 60 to 1000 meshes into the shape of a tube with the aid of an organic plasticizer and an inorganic binder and calcining the molded tube to form a porous ceramic tube possessing pore diameters in the range of 10 to 30 microns and a porosity in the range of 35 to 55%.

BRIEF DESCRIPTION OF THE DRAWINGS

FIG. 6 is a diagram illustrating the condition of use of the conventional apparatus for the application of flux.

PREFERRED EMBODIMENT OF THE INVENTION

Now, the present invention will be described more specifically below with reference to preferred embodiments thereof.

Figure 1:
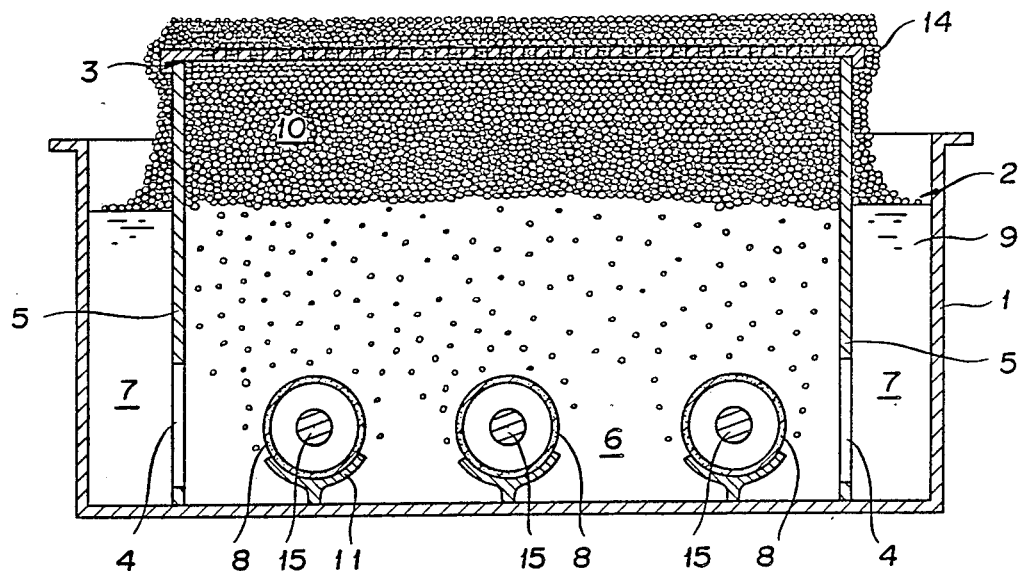
FIG. 1 is a cross section illustrating the condition of use of a typical appratus of the present invention for the application of flux.

The apparatus for the application of flux contemplated by the present invention has a construction substantially similar to the construction of the conventional apparatus for the application of foam flux, except that said porous ceramic tube is obtained by molding at least one species of man-made aggregate of uniform and fine particles in the shape of a tube with the aid of an organic plasticizer and an inorganic binder and calcining the molded tube is used as the porous tube. For example, the apparatus, as illustrated in FIG. 1, comprises a flux tank 1, as partition 5 possessing a top portion 3 rising above the fixed level 2 of flux liquid, containing in the bottom portion thereof a perforated portion 4, and dividing the interior of the flux tank 1 into an inner tank portion 6 and an outer tank portion 7, and plurality of porous ceramic tubes, preferably two or three porous ceramic tubes 8 of the foregoing description disposed inside the inner tank portion 6 as fixed in position with a foam tube retainer 11 and having one end thereof communicate with an external compressed air feed mechanism (not shown) and the other end thereof kept closed.

The aggregate of which the porous ceramic tube 8 incorporated in the apparatus of this invention for the application of flux is made consists of uniform and fine particles preferably having an average particle diameter in the range of 60 to 1,000 mesh. Examples of the material for the aggregate include alumina, silica, mullite, silicon carbide, and silicon nitride. One member or a mixture of two or more members selected from the group of materials cited above can be used. The aggregate of such a material as mentioned above can be prepared as uniform and fine particles of a diameter suiting the particular purpose of application by converting a given material into finely divided particles by means of mechanical crushing and selecting only the particles of a prescribed diameter with an elutriator. This uniformization of the particles of the aggregate is necessary for the purpose of enabling the pores formed in the tube after the calcination to acquire diameters distributed in a narrow range. Examples of the organic plasticizer advantageously used herein include gum arabic, starch, wax, and carboxymethyl cellulose, polyvinyl resins such as polyvinyl chloride, polyvinylidene chloride, polyvinyl alcohol, and polyvinyl acetal, (meth)acrylic acid resins such as polymethyl methacrylate and polymethyl acrylate, and other similar thermoplastic resins. Among other organic plasticizers enumerated above, thermoplastic resins, especially polyvinyl alcohols, which confer ample plasticity even at a small application rate prove to be particularly desirable. Further when a photosensitive resin, a radiation-sensitive resin, or an electron beam-sensitive resin is partially or wholly used as the organic plasticizer, the ceramic material molded in a desired shape is enabled by exposure thereof to light, radiation, or electron beam to solidify in a relatively short span of time and thereafter retain the shape intact. The use of such a resin as mentioned above, therefore, proves to be desirable because the molded ceramic article has no possibility of being deformed during the course of subsequent drying. Incidentally, the organic plasticizer serves the purpose of conferring plasticity upon the aggregate and, at the same time, improving the porosity of the sintered ceramic article. As the inorganic binder, there can be used clay, soda lime, or glass cullet, for example. Optionally a sintering aid such as a carbonate and a borate may be used.

The porous ceramic tube to be used in the apparatus of this invention for the application of flux is obtained by kneading the raw materials, i.e. the aggregate, the organic plasticizer, the inorganic binder, etc. of the foregoing description, molding the resultant blend in the shape of a tube, preferably by the extrusion molding method, drying the molded tube at a temperature in the range of room temperature to about 80° C., and thereafter calcining the dried tube. The calcination temperature is suitably selected in the range of about 900° to 1,300° C., depending on, the kind of the aggregate and the diameter of the particles of the aggregate. The cross-sectional shape of the porous ceramic tube 8 is not always required to be a circle as shown in FIG. 1. No particular limits are imposed on the porous ceramic tube, except for the sole requirement that the tube is capable of generating uniform and microfine bubbles. The cross section of the tube may be in the shape of a polygon or a chrysanthemum. The porous ceramic tube 8 is generally desired to have an outside diameter in the range of 10 to 100 mm, a wall thickness in the range of 1 to 30 mm, and average pore diameter in the range of 10 to 30 microns, 15 to 20 microns, a porosity in the range of 35 to 55%, preferably 40 to 45%. The length of the porous ceramic tube is suitably selected in accordance with the width of the printed board S. To be specific, this length is in the range of 100 to 800 mm.

Figure 2:
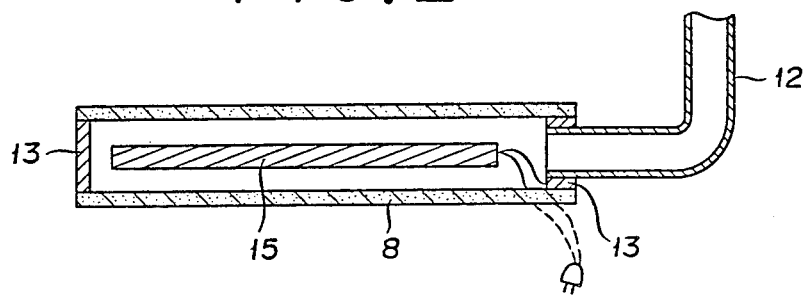
FIG. 2 is a cross section of a porous ceramic tube to be used in the appratus for the application of flux according to the present invention.

The porous ceramic tube 8 of the foregoing description has one end part airtightly connected to a compressed air feed tube 12 which is joined to an external compressed air feed device (not shown) and the other end part closed airtightly as illustrated in FIG. 2. The two members 13, one serving to close the gap between the compressed air feed tube 12 and the porous ceramic tube 8 at one end part and the other to close the porous ceramic tube at the other part, are formed by suitably combining synthetic resins such as silicone and fluorine resin which are not deteriorated as by organic solvents, ceramic substances, metallic substances, and inorganic adhesive agents.

The apparatus of this invention for the application of flux is characterized by incorporating therein porous ceramic tubes described in detail above as a foaming tube. It may be further provided near the top portion of the partition 5 with a net 14 made of a synthetic resin such as silicone or fluorine resin or a metallic substance and adapted to cover the inner tank portion 6 substantially wholly as illustrated in FIG. 1. When the pores in the wall of the porous ceramic tube 8 have sufficiently small diameters say in the range of 1 to 30 $\mu$m, the upper side of the foam flux layer 10 is allowed to retain a stable and uniform flat surface formed of microfine bubbles of flux. When the pores have relatively large diameters as in the range of 30 to 80 $\mu$m, there still exists the possibility that the upper surface of the foam flux layer 10 will undulate or give rise to depressions shaked like craters. In this case, the net 14 serves the purpose of finely dividing giant flux bubbles and stabilizing the upper surface of the foam flux layer 10. The mesh size of this net 14 is selected in accordance with the pore diameter of the porous ceramic tube 8. Generally, it is approximately in the range of 40 to 200 mesh. Optionallly, a plurality of such nets 14 may be used when necessary.

When the operation of the apparatus of this invention for the application of flux is brought to a stop, there ensues the possibility that the flux in its unipaired state or in a sludgy state assumed through deterioration by aging will permeate the pores in the porous ceramic tube 8 and set fast therein. Once this phenomenon takes place, since the pore diameter has been altered by the solidified flux, the air bubbles which are generated when the operation of the apparatus is started lack uniformity and this absence of uniformity has adverse effects on the condition of the upper surface of the foam flux layer. The apparatus of this invention, therefore, is desired to be provided, as illustrated in FIG. 1, in the porous ceramic tube 8 with a heat generator 15 such as an electric heater so as to permit fusion of the solidified flux. The temperature of the heat produced by this heat generator must be controlled so that the flux will be prevented from being thermally decomposed or ignited.

Further in the apparatus of this invention for the application of flux, the resistance offered to the flow of air decreases in proportion as the diameters of the pores in the porous ceramic tube increase. Where the amount of the compressed air to be required is large and the number of porous ceramic tubes 8 to be used is large, therefore, the compressed air from the compressed air feed mechanism must be supplied uniformly in a well balanced manner. If this requirement is not fulfilled, the bubbles of flux to be generated are varied in size and amount possibly to the extent of heavily disturbing the condition of the upper surface of the foam flux layer 10. It is, therefore, desirable to have an automatic air pressure adjuster interposed between the compressed air feed mechanism and the porous ceramic tube. Though the pressure of air to be used is variable with the diameters of the pores in the porous ceramic tube and the number of porous ceramic tubes, it is approximately in the range of 1 to 3 kg/cm$^2$.

Figure 3:
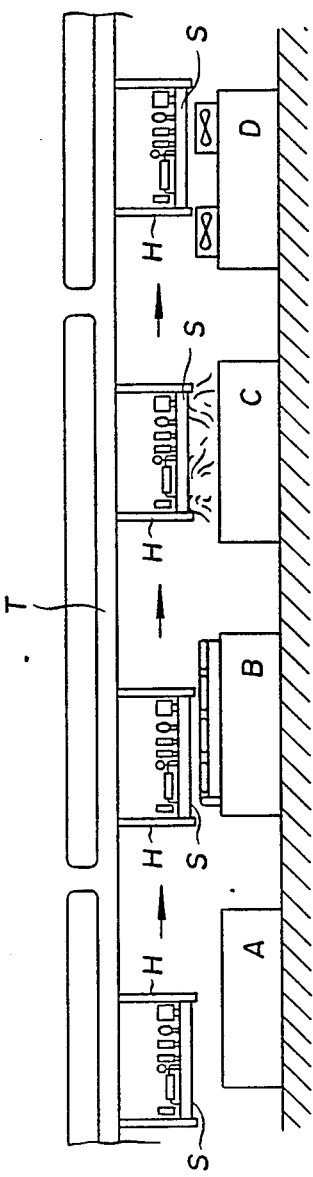
FIG. 3 is a diagram illustrating a typical use of the apparatus for the application of flux according to this invention in a system for soldering printed boards.

The apparatus for the application of flux contemplated by this invention is used in the automatic system for soldering printed boards as follows. The automatic system for soldering printed boards is formed by having the apparatus A of this invention for the application of flux, a preheating unit B, a solder tank unit C, cooling unit D, etc. disposed sequentially along the path of conveyance as illustrated in FIG. 3, for example. To be processed in this system, printed boards S having various electronic parts mounted thereon are retained fast on a retaining device H such as, for example, a chain joined in a conveying mechanism and advanced first onto the apparatus A for the application of flux. On the apparatus A for the application of flux, when the compressed air is introduced from the compressed air feed mechanism (not shown), uniform and very fine air bubbles are generated through the pores of the porous ceramic tubes 8 so as to foam the flux liquid 9 as illustrated in FIG. 1. The foam flux liquid 9 rises up the interior of the partition 5 and forms a foam layer 10 on the upper side of the inner tank portion. The foam layer 10 is retained stably by constantly allowing portion of the foam flux liquid to overflow the top portion 3 of the partition 5 and fall down into the outer tank 7 and, in the meanwhile, incorporating therein the uniform and very fine foam flux liquid continuously rising from the porous ceramic tubes. As the result, the upper surface of the foam layer 10 is uniform and flat and free from giant bubbles. The printed boards S brought in on the conveying mechanism, on arrival in the apparatus A for the application of flux, are allowed to contact the upper surface of the foam flux layer 10 uniformly and thoroughly. Owing to this contact, the uniform and very fine foam flux is fractured and the flux liquid scattered by the consequent impact lands on and covers the surfaces of the printed boards intended for soldering.

The printed boards S which have been coated with the flux as described above are then conveyed to the preheating unit B, there to be preheated to a temperature in the range of 40° C. to 80° C. so as to ensure that the soldering will be effected advantageously. They are subsequently forwarded onto the solder tank unit C. The surfaces of the printed boards S for soldering have been coated uniformly and thoroughly with the flux during their travel through the apparatus A for the application of flux and consequently have been completely deprived of an oxide film deterimental to the soldering. As the surfaces are brought into contact with the fused solder in the solder tank, the solder is allowed to adhere intimately to the sufaces. Subsequently, the printed boards S are conveyed onto the cooling unit D, there to be thoroughly cooled so as to ensure fast adhesion of the solder. The printed boards S, having undergone the series of works, are forwarded to the subsequent step.

Now, the present invention will be described more specifically below with reference to working examples.

EXAMPLES 1-4 AND CONTROLS 1-4

Figure 4:
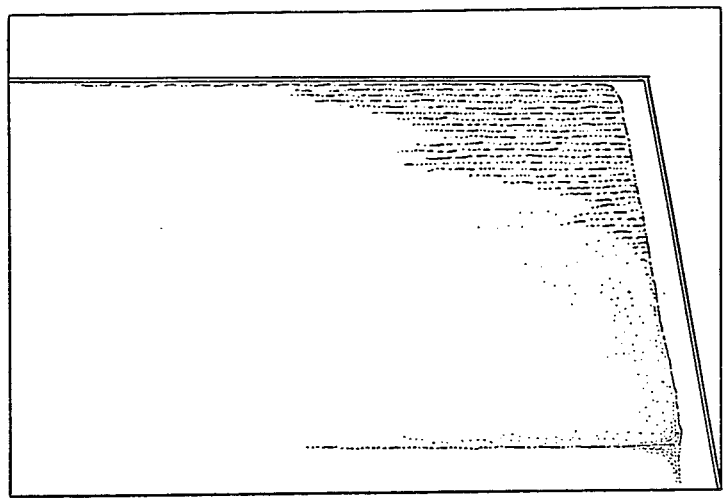
FIG. 4 is a perspective view illustrating the condition of a foam layer in a typical apparatus for the application of flux according to this invention.
Figure 5:
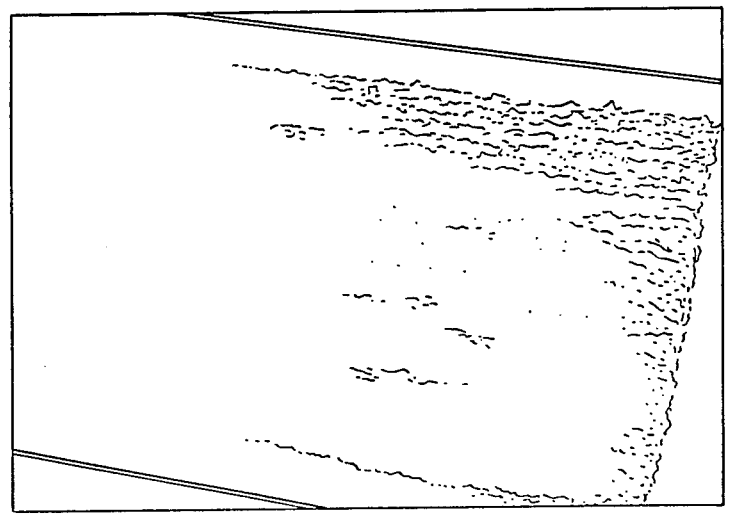
FIG. 5 is a perspective view illustrating the condition of a foam layer in a conventional apparatus for the application of flux.

In a flux tank 540 mm in width, 700 mm in length, and 120 mm in height, a partition possessing a perforation in the bottom portion thereof and measuring 160 mm in height was inserted to form an inner tank portion 440 mm in width, 620 mm in length, and 120 mm in height. Near the bottom portion of the interior of the inner tank portion, three porous ceramic tubes measuring 40 mm in outside diameter, 23 mm in inside diameter, and 360 mm in length were disposed at intervals of 150 mm as connected at one end thereof to a compressed air feed mechanism and closed completely at the other end thereof. The porous ceramic tubes had an average pore diameter as shown in Table 1 and a porosity of 43%. Into the apparatus for application of flux constructed as described above, a flux liquid having a specific gravity of 0.835 and a liquid temperature of 20° C. was poured until the liquid level rose to a height of 50 mm from the upper sides of the porous ceramic tubes. Then, at a room temperature of 19° C., the compressed air of 1.5 to 2 kg/cm$^2$ was fed from the compressed air feed mechanism into the interiors of the porous ceramic tubes to form flux layer. The foam layer was made up of uniform and very fine bubbles and had as smooth upper surface as illustrated in FIG. 4 (Example 2).

Then the apparatus was incorporated in a system for soldering printed boards provided with LSIs, resistances, condensors and transistors having respectively lead-throughs on an upper side surface of a substrate and some ICs on an under side surface of the substrate, and operated to solder printed boards. The results were shown in Table 1.

TABLE 1

| Example | Average pore diameter of ceramic (μm) | Number of treated boards (pieces) | Operation time (hours) | Percentage of inferior quality (%) |
|---|---|---|---|---|
| Control 1 | 80 | 43,200 | 7 | 99.3 |
| Control 2 | 60 | 43,200 | 7 | 98.6 |
| Control 3 | 45 | 43,200 | 7 | 90 |
| Example 1 | 30 | 43,200 | 7 | 1.1 |
| Example 2 | 20 | 43,200 | 7 | 0.3 |
| Example 3 | 15 | 43,200 | 7 | 0.3 |
| Example 4 | 10 | 43,200 | 7 | 0.4 |
| Control 4 | 5 | —* | — | — |

*It did not overflow.

EXAMPLES 5-9 AND CONTROLS 5-7

In a flux tank 450 mm in width, 650 mm in length, and 100 mm in height, a partition possessing a perforation in the bottom portion thereof and measuring 140 mm in height was inserted to form an inner tank portion 320 mm in width, 500 mm in length, and 100 mm in height. Near the bottom portion of the interior of the inner tank portion, three porous ceramic tubes measuring 50 mm in outside diameter, 30 mm in inside diameter, and 242 mm in length were disposed at intervals of 450 mm as connected at one end thereof to a compressed air feed mechanism and closed completely at the other end thereof. The porous ceramic tubes had an average pore diameter as shown in Table 2 and a porosity of 43%. Into the apparatus for application of flux constructed as described above, a flux liquid having a specific gravity of 0.82-0.85 and a liquid temperature of 23° C. was poured until the liquid level rose to a height of 50 mm from the upper sides of the porous ceramic tubes. Then, at a room temperature of 19° C., the compressed air of 1.0 to 1.5 kg/cm$^2$ was fed from the compressed air feed mechanism into the interiors of the porous ceramic tubes to form flux layer.

Then the apparatus was incorporated in a system for soldering printed boards provided with LSIs, resistances, condensors and transistors having respectively lead-throughs on an upper side surface of a substrate and some ICs on an under side surface of the substrate, and operated to solder printed boards. The results were shown in Table 2.

TABLE 2

| Example | Average pore diameter of ceramic (μm) | Number of treated boards (pieces) | Operation time (hours) | Percentage of inferior quality (%) |
|---|---|---|---|---|
| Control 5 | 45 | 15,000 | 5 | 88 |
| Control 6 | 35 | 15,000 | 5 | 62 |
| Example 5 | 30 | 15,000 | 5 | 1 |
| Example 6 | 27 | 15,000 | 5 | 0.6 |

TABLE 2-continued

| Example | Average pore diameter of ceramic (μm) | Number of treated boards (pieces) | Operation time (hours) | Percentage of inferior quality (%) |
|---|---|---|---|---|
| Example 7 | 20 | 15,000 | 5 | 0.8 |
| Example 8 | 15 | 15,000 | 5 | 1.1 |
| Example 9 | 10 | 15,000 | 5 | 1.3 |
| Control 7 | 5 | —* | — | — |

*It did not overflow

EXAMPLES 10–13 AND CONTROLS 8–9

In a flux tank 440 mm in width, 440 mm in length, and 100 mm in height, a partition possessing a perforation in the bottom portion thereof and measuring 150 mm in height was inserted to form an inner tank portion 340 mm in width, 340 mm in length, and 100 mm in height. Near the bottom portion of the interior of the inner tank portion, three porous ceramic tubes measuring 40 mm in outside diameter, 23 mm in inside diameter, and 300 mm in length were disposed at intervals of 60 mm as connected at one end thereof to a compressed air feed mechanism and closed completely at the other end thereof. The porous ceramic tubes had an average pore diameter as shown in Table 3 and a porosity of 43%. Into the apparatus for application of flux constructed as described above, a flux liquid having a specific gravity of 0.838 and a liquid temperature of 22° C. was poured until the liquid level rose to a height of 40 mm from the upper sides of the porous ceramic tubes. Then, at a room temperature of 19° C., the compressed air of 1.0 to 1.5 kg/cm² was fed from the compressed air feed mechanism into the interiors of the porous ceramic tubes to form flux layer.

Then the apparatus was incorporated in a system for soldering printed boards provided with LSIs, resistances, condensors and transistors having respectively lead-throughs on an upper side surface of a substrate and some ICs on an undr side surface of the substrate, and operated to solder printed boards. The results were shown in Table 3.

TABLE 3

| Example | Average pore diameter of ceramic (μm) | Number of treated boards (pieces) | Operation time (hours) | Percentage of inferior quality (%) |
|---|---|---|---|---|
| Control 8 | 45 | 12,600 | 6 | 90.3 |
| Example 10 | 30 | 12,600 | 6 | 1.2 |
| Example 11 | 20 | 12,600 | 6 | 0.4 |
| Example 12 | 15 | 12,600 | 6 | 0.5 |
| Example 13 | 10 | 12,600 | 6 | 1.3 |
| Control 9 | 5 | —* | — | — |

*It did not overflow

As described above, the present invention is directed to an apparatus for the application of foam flux in a system for soldering printed boards, comprising a flux tank, a partition possessing a top portion rising above the fixed level of flux liquid, containing near the bottom portion thereof a perforated portion, and serving to divide the interior of the flux tank into an inner tank portion and an outer tank poriton, and plurality of porous tubes disposed inside an inner tank portion and having one end thereof communciating with an external compressed air feed mechanism and other end thereof closed, which porous tubes are characterized by the fact that they are porous ceramic tubes obtained by extrusion molding an aggregate of uniform and fine ceramic-forming particles having average particle diameter of 60 to 1000 meshes into the shape of a tube with the aid of an organic plasticizer and an inorganic binder and calcining the molded tube to form a porous ceramic tube possessing pore diameters in the range of 10 to 30 microns and a porosity in the range of 35 to 55%. Thus, this apparatus is capable of forming a foam flux layer of uniform and very fine flux bubbles and possessing a smooth flat surface, permitting uniform application of flux to printed boards, repressing the possibility of occurrence of rejectable products due to defective soldering, speeding up the process of soldering. This apparatus warrants an economy of not less than about 20% as compared with the conventional apparatus for the application of flux which using tubes of sintered metal as porous tubes.

What is claimed is:

1. An apparatus for the application of foam flux in a system for soldering printed boards, comprising a flux tank having means for maintaining a fixed level of flux liquid therein, a partition possessing a top portion rising above the fixed level of flux liquid and a bottom portion, said partition containing in the bottom portion thereof a perforated portion, and serving to divide the interior of said flux tank into an inner tank portion and an outer tank portion, and a plurality of porous tubes disposed inside said inner tank portion and having one end thereof communicating with an external compressed air feed mechanism and the other end thereof closed, the improvement wherein said porous tubes are porous ceramic tubes possessing pore diameters in the range of 10 to 30 microns and a porosity in the range of 35 to 55%.

2. An apparatus according to claim 1, wherein said plurality of porous tubes are two or three.

3. An apparatus according to claim 1, wherein said plurality of porous tubes are three.

4. An apparatus according to any one of claims 1–3, wherein which further comprises a net of 40 to 200 meshes disposed near the top portion of said partition and serving substantially to cover said inner tank portion.

5. An apparatus for the application of foam flux in a system for soldering printed boards, comprising a flux tank having means for maintaining a fixed level of flux liquid therein, a partition possessing a top portion rising above the fixed level of flux liquid and a bottom portion, said partition containing in the bottom portion thereof a perforated portion, and serving to divide the interior of said flux tank into an inner tank portion and an outer tank portion, and a plurality of porous tubes disposed inside the inner tank portion and having one end thereof communicating with an external compressed air feed mechanism and the other end thereof closed, the improvement wherein said porous tubes are porous ceramic tubes possessing pore diameters in the range of 10 to 30 microns and a porosity in the range of 35 to 55%, wherein said porous ceramic tubes are provided with a heat generator.

6. An apparatus for the application of foam flux in a system for soldering printed boards, comprising a flux tank having means for maintaining a fixed level of flux liquid therein, a partition possessing a top portion rising above a level of flux liquid and a bottom portion, said partition containing in the bottom portion thereof a perforated portion, and serving to divide the interior of said flux tank into an inner tank portion and an outer tank portion, and a plurality of porous tubes disposed inside the inner tank portion and having one end thereof communicating with an external compressed air feed mechanism and the other end thereof closed, the improvement wherein said porous tubes are porous ceramic tubes possessing pore diameters in the range of 10 to 30 microns and a porosity in the range of 35 to 55%, which further comprises a net of 40 to 2000 meshes disposed near the top portion of said partition and serving substantially to cover said inner tank portion, and wherein said porous ceramic tubes are provided with an axially-disposed heat generator.

7. An apparatus for the application of foam flux in a system for soldering printed boards, comprising a flux tank having means for maintaining a fixed level of flux liquid therein, a partition possessing a top portion rising above the fixed level of flux liquid and a bottom portion, said partition containing in the bottom portion thereof a perforated portion, and serving to divide the interior of said flux tank into an inner tank portion and an outer tank portion, and at least one porous tube disposed inside the inner tank portion having one end thereof communicating with an external compressed air feed mechanism and the other end thereof closed, the improvement wherein said porous tube is a porous ceramic tube possessing pore diameters in the range of 10 to 50 $\mu$m and a porosity in the range of 35 to 55 percent, wherein said porous ceramic tube is provided therein with a heat generator.

8. An apparatus for the application of foam flux in a system for soldering printed boards, comprising a flux tank having means for maintaining a fixed level of flux liquid therein, a partition possessing a top portion rising above the fixed level of flux liquid and a bottom portion, said partition containing in the bottom portion thereof a perforated portion, and serving to divide the interior of said flux tank into an inner tank portion and an outer tank portion, and at least one porous tube disposed inside the inner tank portion and having one end thereof communicating with an external compressed air feed mechanism and the other end thereof closed, the improvement wherein said porous tube is a porous ceramic tube possessing pore diameters in the range of 10 to 50 $\mu$m and a porosity in the range of 35 to 55 percent, which further comprises a net of 40 to 2000 meshes disposed near the top portion of said partition and serving substantially to cover said inner tank portion, and wherein said porous ceramic tube is provided with an axially disposed heat generator.

* * * * *

UNITED STATES PATENT AND TRADEMARK OFFICE
CERTIFICATE OF CORRECTION

PATENT NO. : 4,934,307

DATED : June 19, 1990

INVENTOR(S) : Ikuo Sumiyoshi

It is certified that error appears in the above-identified patent and that said Letters Patent is hereby corrected as shown below:

Column 1, line 50; "complicate" should read -- complicated --.

Column 2, line 61; "ascribable the" should read -- ascribable to the --.

Column 5, line 39; "on, the" should read -- on the --.

Column 6, line 16; "shaked" should read -- shaped --.

Column 6, line 22; "Optionallly," should read -- Optionally, --.

Column 6, line 26; "unipaired" should read -- unimpaired --.

Column 7, line 14; "allowing portion" should read -- allowing a portion --.

Column 9, line 40; "undr" should read -- under --.

Column 10, line 15; "using" should read -- uses --.

Signed and Sealed this

Nineteenth Day of November, 1991

Attest:

HARRY F. MANBECK, JR.

*Attesting Officer*  *Commissioner of Patents and Trademarks*